(12) United States Patent
Aichner et al.

(10) Patent No.: US 8,975,972 B2
(45) Date of Patent: Mar. 10, 2015

(54) OSCILLATOR SYSTEM

(75) Inventors: Michael Aichner, Strassen (AT); Mattias Welponer Bachmayer, Graz (AT); Martin Flatscher, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/541,998

(22) Filed: Jul. 5, 2012

(65) Prior Publication Data

US 2014/0009234 A1  Jan. 9, 2014

(51) Int. Cl.
*H03L 3/00* (2006.01)
*H03B 5/32* (2006.01)

(52) U.S. Cl.
USPC ............... 331/49; 331/55; 331/57; 331/158; 331/173; 327/298

(58) Field of Classification Search
USPC ........ 327/298; 331/2, 46, 49, 55, 56, 74, 158, 331/172, 173, 179, 116 FE, 116 M, 116 R, 331/154, 160, 57
See application file for complete search history.

(56) References Cited

U.S. PATENT DOCUMENTS

| | | | | |
|---|---|---|---|---|
| 5,196,810 | A * | 3/1993 | Graether et al. | 331/49 |
| 5,534,826 | A * | 7/1996 | Logan | 331/158 |
| 5,610,558 | A * | 3/1997 | Mittel et al. | 331/2 |
| 5,929,713 | A * | 7/1999 | Kubo et al. | 331/49 |
| 6,020,781 | A * | 2/2000 | Fujioka | 327/541 |
| 6,133,801 | A * | 10/2000 | Tanaka | 331/158 |
| 6,157,265 | A * | 12/2000 | Hanjani | 331/49 |
| 6,215,367 | B1 | 4/2001 | Blaud et al. | |
| 6,420,939 | B1 | 7/2002 | Selz | |
| 7,009,458 | B2 * | 3/2006 | Gazit | 331/116 R |
| 7,030,709 | B2 * | 4/2006 | Novac | 331/158 |
| 7,065,668 | B2 * | 6/2006 | Kosuda et al. | 713/500 |
| 7,808,334 | B2 * | 10/2010 | Yoshida et al. | 331/158 |
| 8,120,439 | B2 * | 2/2012 | Shrivastava et al. | 331/160 |
| 8,237,513 | B2 * | 8/2012 | Muench et al. | 331/2 |
| 2011/0001570 | A1 * | 1/2011 | Niwa | 331/108 R |
| 2011/0291767 | A1 * | 12/2011 | Ishikawa et al. | 331/154 |

* cited by examiner

*Primary Examiner* — Levi Gannon
(74) *Attorney, Agent, or Firm* — Eschweiler & Associates, LLC (57) ABSTRACT

An oscillator system includes a first oscillator, a second oscillator, and a changeover component. The first oscillator is configured to generate a first signal at a selected frequency. The second oscillator is configured to generate a second signal at about the selected frequency. The changeover component is configured to generate a changeover output signal according to the first signal and the second signal.

20 Claims, 5 Drawing Sheets

OSCILLATOR SYSTEM

BACKGROUND OF THE INVENTION

An oscillator is a type of circuit that generates a repetitive signal. Oscillators are used in most circuits to generate frequency references, which might be used for processors, digital control circuits, phase locked loops, switched capacitor circuits, and the like. The generated, repetitive signal repeats every time period and operates with a selected frequency and waveform. The waveform can include, for example sawtooth waveforms and sine waves.

One feature oscillators are characterized by is the frequency of their signal. Signals in the audio range can have frequencies ranging from 16 Hz to 20 kHz. Signals in the radio frequency (RF) range typically have frequencies ranging from 100 kHz to 100 GHz. Crystal oscillators are available from kHz up to several 10 MHz.

Another feature oscillators are characterized by is their startup time. This is the time from which the oscillator is off or deactivated until the time when the oscillator is generating a steady, reliable oscillating signal.

DETAILED DESCRIPTION OF THE INVENTION

The present invention will now be described with reference to the attached drawing figures, wherein like reference numerals are used to refer to like elements throughout, and wherein the illustrated structures and devices are not necessarily drawn to scale.

The present invention includes embodiments that compensate for technology variations or spreads in multiple die packages or devices. Information related to the variations is utilized to compensate signals and the like to mitigate the impact of those variations.

Figure 1A:
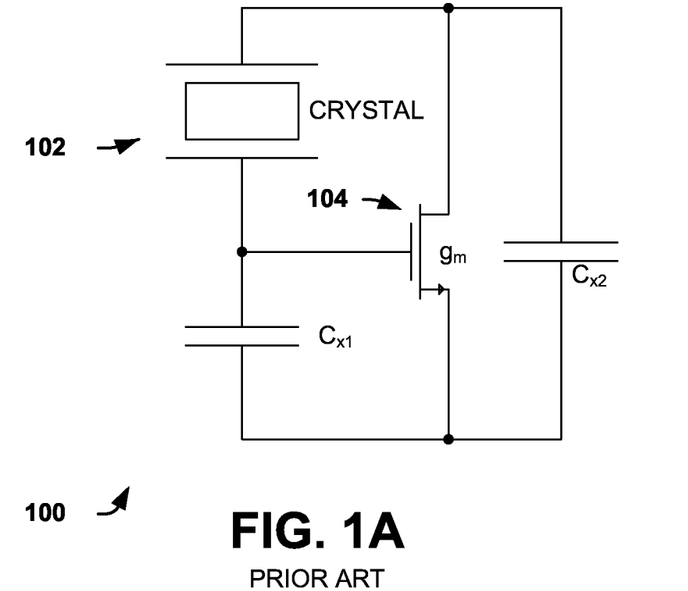
FIG. 1A is a circuit diagram for a crystal oscillator circuit.

FIG. 1A is a circuit diagram for a crystal oscillator circuit 100. The circuit is provided as an example of a crystal oscillator circuit in order to facilitate an understanding of the present invention. The circuit 100 is a single stage oscillator. It is noted that if the gate of the transistor is grounded, it becomes a Colpitts oscillator. If the source of the transistor is connected to ground, as here, it is a Pierce oscillator. If the drain of the transistor is connected to ground, it is a Santos oscillator.

A crystal oscillator is an electronic circuit that uses mechanical resonance of a vibrating crystal of piezoelectric material to create a signal with a stable and precise frequency. The circuit 100 also provides negative resistance in order to facilitate operation of the oscillator circuit 100. The negative resistance results in a drop in voltage for increasing current, opposite the effect of conventional resistance. The circuit 100 includes a capacitive feedback.

A single stage oscillator, such as the oscillator circuit 100, is a proven, reliable oscillator. Typically, there are no or low risks of undesirable parasitic oscillations arising. Further, low power consumption can be obtained by using a proper design. However, these types of oscillator circuits have relatively slow starting times, when compared with multi-stage oscillator circuits.

The circuit 100 includes a crystal 102 coupled to a gate and a drain of a transistor 104. The transistor 104 has a transconductance of $g_m$. A first capacitor $C_{x1}$ is coupled to the gate and a source of the transistor 104. A second capacitor $C_{x2}$ is coupled to the drain and the source of the transistor 104.

The starting time, also referred to as the starting time constant, can be optimized using the effective negative resistance of the oscillator circuit 100. This is obtained by having as large as possible absolute value of the negative resistance as possible during the oscillator starting process in order to yield a faster starting time. During the starting process, a relatively larger bias current is supplied at the start than is later necessary in order to merely maintain the oscillation. However, it is noted that a further increase in the magnitude of the bias current beyond an optimum starting point reduces the negative resistance, resulting in a slower starting time. Thus, both small and excessively large starting currents result in slower starting times. Even if the optimum amount of bias current is provided ($g_{m,opt}$), the starting time remains relatively slow due to the negative resistance being limited.

Figure 1B:
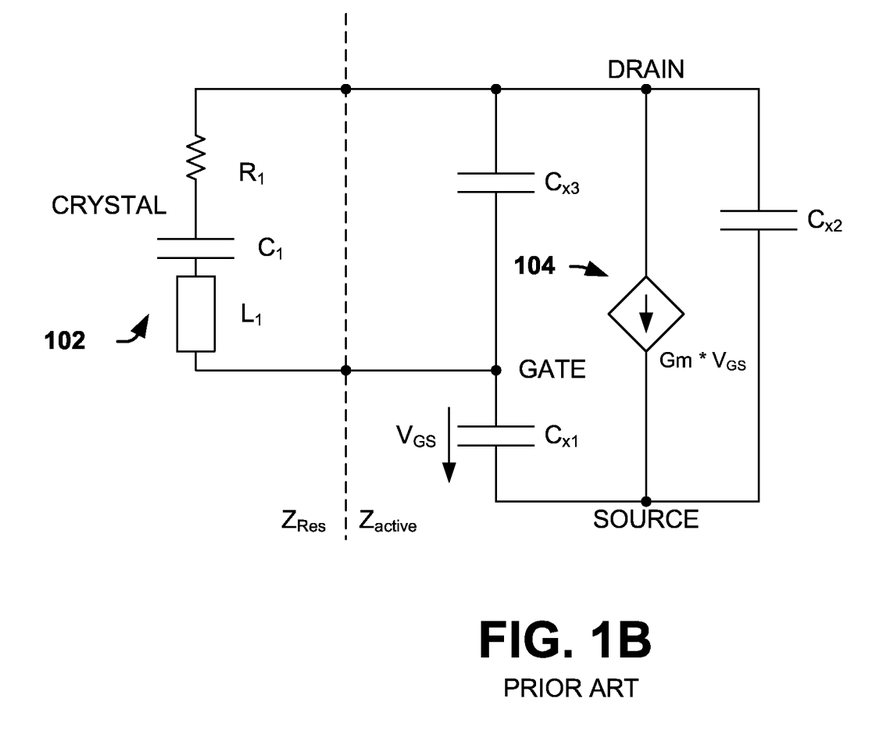
FIG. 1B is an equivalent circuit diagram for the circuit of FIG. 1A.

FIG. 1B is an equivalent circuit diagram for the circuit 100 of FIG. 1A. Here, the crystal 102 is shown as components $R_1$, $C_1$, and $L_1$. The circuit 100 has a positive resistance $Z_{Res}$ derived from the crystal 102. The negative resistance of the circuit 100 is derived from the active components shown and designated as $Z_{active}$. The formula for the negative resistance is provided as follows:

$$Z_{active} = (g_m + 2jwC_{x1})/(jwC_{x3}g_m - w^2C_{x1}^2 - 2C_{x3}/C_{x1}w^2C_{x1}^2)$$

for $C_{x1} = C_{x2}$

The negative resistance $Z_{active}$ has an optimum for $g_m$. In other words, increasing the magnitude of the current (and thereby $g_m$) does not result in an increase in the absolute value of the negative resistance after a particular current.

Figure 2:
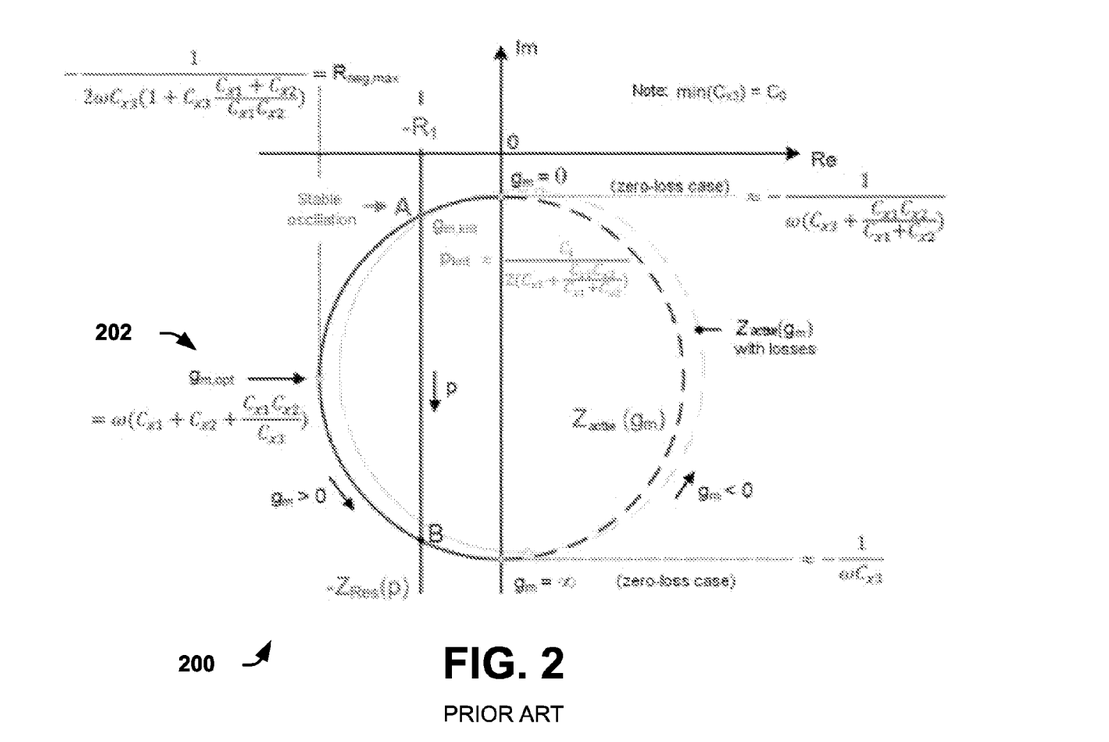
FIG. 2 is a graphical representation of an impedance locus diagram for the single stage oscillator circuit shown in FIGS. 1A and 1B.

FIG. 2 is a graphical representation of an impedance locus diagram 200 for the single stage oscillator circuit shown in FIGS. 1A and 1B. The negative resistance $Z_{active}$ is responsible for the starting behavior of the circuit 100. The negative resistance is complex and includes both real and imaginary parts. The diagram plots the negative resistance $Z_{active}$ as a function of $g_m$.

The diagram 200 includes an x-axis for real values and a y-axis for imaginary values. The real part of the negative resistance $Z_{active}$ is plotted along the x-axis. The imaginary part of the negative resistance is plotted along the y-axis.

It can be seen from the diagram 200 that a stable oscillation requires the real part of the negative resistance to be at least R1. Below R1, stable oscillations are not obtained. An optimum gm ($g_{m,opt}$) is found that provides a stable oscillation value and it indicated at position 202. The equation for this is as follows:

$$g_{m,opt} = w(C_{x1} + C_{x2} + C_{x1}C_{x2}/C_{x3})$$

The optimum $g_{m,opt}$ produces a maximum absolute value of the real part of the negative resistance. The higher the absolute value, the faster the oscillator starts.

As stated above, single stage crystal oscillators produce reliable oscillator operation with relatively low power consumption. However, even with a proper $g_m$ value selected, starting times can be relatively slow.

Another type of oscillator is a multi-stage oscillator. These oscillators use multiple stages instead of a single stage (as in circuit 100) and have faster starting times. As a result of using multiple stages, there is theoretically no limitation on the negative resistance. Thus, an additional degree of freedom exists (as a result of the additional gain), which allows greater absolute values to be set for the negative resistance than in the case of single-stage oscillator circuits. However, multi-stage oscillators can be less reliable and can be prone to parasitic oscillations. In order to improve reliability, additional components and complexity are required, especially for varied operating conditions.

Figure 3:
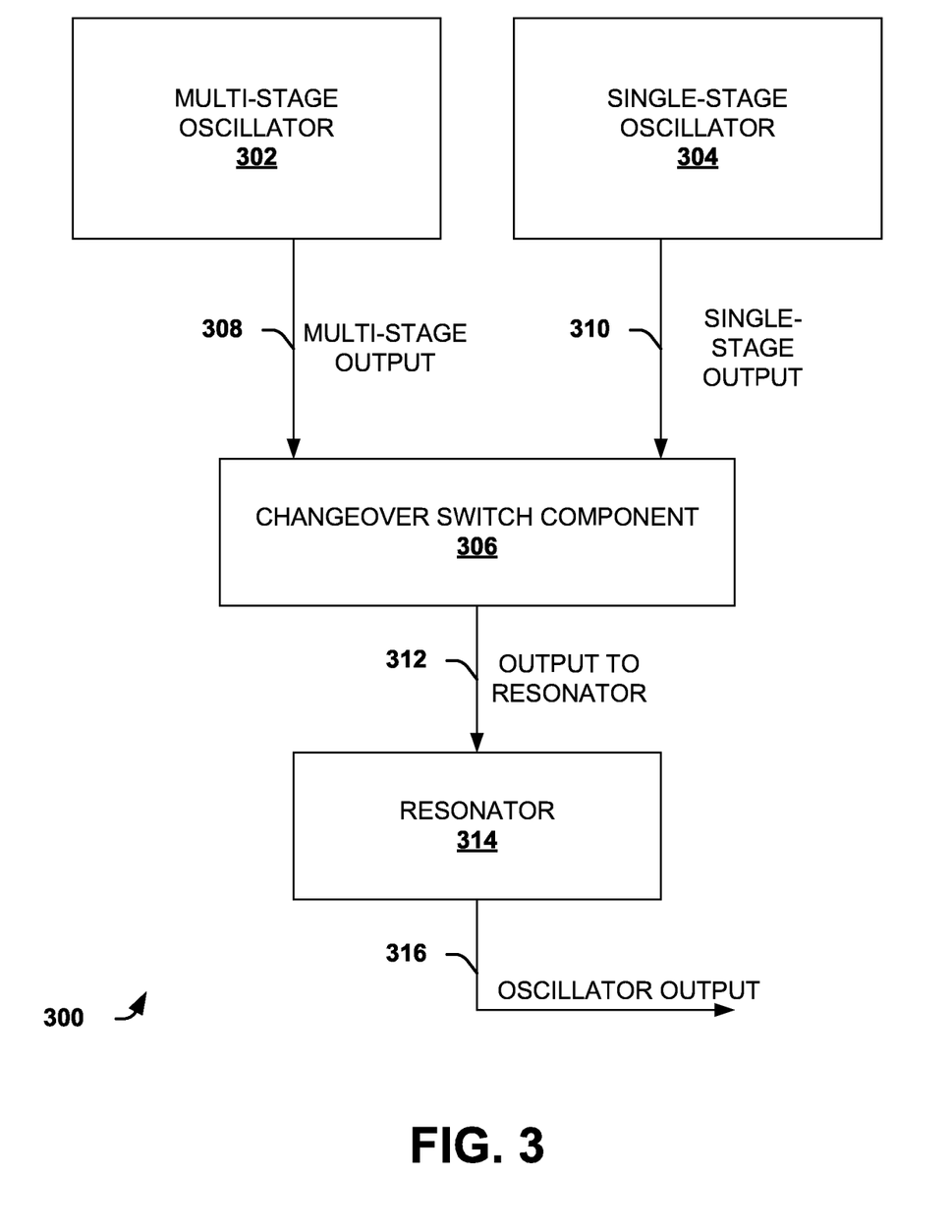
FIG. 3 is a block diagram of an oscillator system in accordance with an embodiment of the invention.

FIG. 3 is a block diagram of an oscillator system 300 in accordance with an embodiment of the invention. The system combines varied oscillator structures to obtain the benefit of varied structures in a single system. As a result, a faster starting oscillator can be combined with a lower power and more reliable oscillator to yield faster starting times with lower power and higher reliability.

The system 300 includes a multi-stage oscillator 302, a single stage oscillator 304, a changeover switch component 306, and a resonator 314. The single stage oscillator 304 provides lower power and higher reliability, but with a slower starting time. The multi-stage oscillator 302 provides faster oscillation starting times. The multi-stage oscillator 302 includes a relatively large negative resistance, which results in the faster oscillation starting times.

The single stage oscillator 304 is a single stage oscillator, such as a Pierce oscillator. The single stage oscillator 304 provides a single stage output 310, which is an oscillation signal at a first selected frequency. The oscillator output 310 is not substantially altered by various operating conditions, such as temperature, process, power supply, and the like fluctuations.

The multi-stage oscillator 302 is a multi-stage oscillator and provides a multi-stage output 308, which is another oscillation signal. The multi-stage output 308 can be altered by various operating conditions, such as temperature, process, power supply, and the like fluctuations. As a result, the output 308 can vary from the second selected frequency. Further, the multi-stage oscillator 302 tends to consume more power than the single stage 304.

The changeover component 306 is coupled to the single stage oscillator 304 and the multi-stage oscillator 302. The changeover component 306 receives both outputs 308 and 310. The changeover component 306 provides a changeover output 312 signal. The output signal 312 is derived from the received outputs 308 and 310 and is provided to the resonator 314.

The changeover component 306 combines or selects one or more of the outputs 308 and 310 to derive or generate the changeover output 312 signal. In this example, the multi-stage oscillator 302 has a faster starting time, thus the multi output 308 is used initially. After some amount of time, the single stage oscillator 304 has sufficiently started and the changeover component 306 utilizes the single stage output 310 to derive the changeover output 312. Once the single stage output 310 is being utilized, the changeover component 306 can cause the multi-stage oscillator 302 to power down and mitigate power consumption.

The changeover component 306 can utilize suitable switch mechanisms, mixers, and the like to direct stage output signals 308 and 310 to the changeover output signal 312. The changeover component 306 determines when and which signal to utilize. In one example, the changeover component 306 uses the multi-stage output signal 308 for a first period of time and then switches to the single stage output signal 310. In another example, the changeover component 306 initially uses the multi-stage output signal 308 and monitors the single-stage oscillator 304. On determining that the single stage oscillator 304 is producing a stable output signal at the second selected frequency for the signal 310, the changeover component 306 uses the single stage output 310.

The changeover component 306 determines when the single stage oscillator 304 is producing a stable output signal by utilizing a suitable technique. In one example, the changeover component 306 uses an amplitude detector to monitor an amplitude of the single-stage output signal 310. On the amplitude reaching a threshold value, the changeover component 306 determines that the single-stage output signal 310 is stable enough and disables or switches from the multi-stage output signal 308. In another example, the changeover component 306 includes a timer and determines that the single stage output signal 310 is stable once the timer has expired. Once the timer is expired, the changeover component 306 disables the multiple stage output signal 308.

The resonator 314 receives the changeover output signal 312 and generates an oscillator output signal 316, also referred to as a system output. By utilizing the stages 302 and 304, the system 300 provides the oscillator output signal 316 with a relatively short starting time, a stable, reliable oscillation signal, and relatively low power consumption. The multi-stage oscillator 302 provides the relatively short starting time and the single stage oscillator 304 provides the stable reliable signal and relatively low power consumption.

It is noted that FIG. 3 is described with a single stage oscillator and a multi-stage oscillator. However, it is appreciated that other variations are contemplated and in accordance with the invention. For example, more than two oscillators can be coupled to the changeover component.

Figure 4:
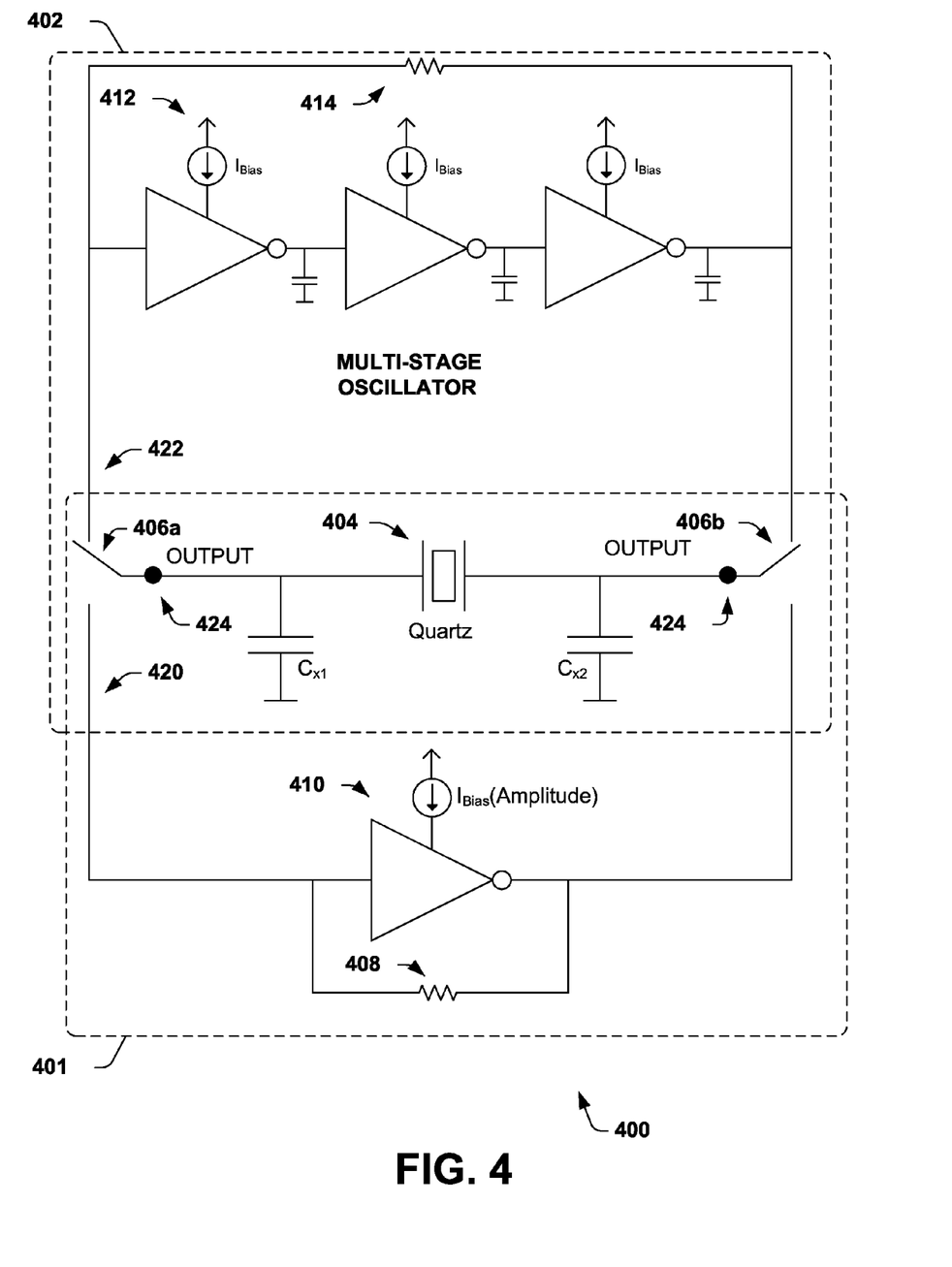
FIG. 4 is a simplified circuit diagram of an oscillator system in accordance with an embodiment of the invention.

FIG. 4 is a simplified circuit diagram of an oscillator system 400 in accordance with an embodiment of the invention. The system 400 combines varied oscillator structures to obtain the benefit of varied structures in a single system. As a result, a faster starting oscillator can be combined with a lower power and more reliable oscillator to yield faster starting times with lower power and higher reliability.

The system 400 is similar to the above described system 300, but includes additional details in order to facilitate an understanding of the present invention. It is appreciated that the invention is not limited to the particular components described herein.

The system 400 includes a single stage oscillator or oscillator structure 401, a multi-stage oscillator or oscillator structure 402, and a changeover component 406 (406a and 406b). The single stage oscillator structure 401 provides lower power and higher reliability, but with a slower starting time. The multi-stage oscillator structure 402 provides a relatively faster oscillation starting time. The multi-stage oscillator structure 402 includes a relatively large negative resistance, which results in the faster oscillation starting times.

The single stage oscillator 401 is a single stage oscillator in that it utilizes a single simplification stage. The single stage oscillator 401 provides a single stage output signal 420, which is an oscillation signal at a first selected frequency. The oscillator output signal 420 is not substantially altered by various operating conditions, such as temperature, process, power supply, and the like fluctuations.

The single stage oscillator 401 utilizes a crystal 404, a first capacitor ($C_{x1}$), and a second capacitor ($C_{x2}$) and includes an amplifier 410, and a feedback component ($R_{F1}$) 408. The crystal 404 is selected according to a desired resonant frequency and to generate a selected frequency. The crystal 404 can also be selected according to additional factors such as, cost, size, reliability, and the like. The first capacitor ($C_{x1}$) and the second capacitor ($C_{x2}$) are typically designed to have substantially similar capacitance values.

The amplifier 410 and the feedback component 408 comprise the single stage for the oscillator 401. The amplifier 410 is designed with a bias current ($I_{Bias}$) in order to increase or maximize the negative resistance. This, in turn, improves the starting time for oscillation. The bias current is selected, as discussed above with regard to FIG. 2, to yield the desired negative resistance.

The multi-stage oscillator 402 is a multi-stage oscillator and provides a multi-stage output 422, which is another oscillation signal at about the selected frequency. The multi-stage output 422 can be altered by various operating conditions, such as temperature, process, power supply, and the like fluctuations. As a result, the output 422 can vary from the second selected frequency. Further, the multi-stage oscillator 402 tends to consume more power than the single stage 401.

The multi-stage oscillator 402 utilizes the crystal 404, the first capacitor ($C_{x1}$), and the second capacitor ($C_{x2}$) and includes multiple amplifiers 412 and a feedback component ($R_{F2}$) 414. In this example, the oscillator 402 is shown with 3 (three) amplifiers connected in series. However, it is appreciated that alternate embodiments can include varied numbers of amplifiers.

The crystal 404 is configured to have a selected resonant frequency and can also be selected according to additional factors such as, cost, size, reliability, and the like. As stated above, the first capacitor ($C_{x1}$) and the second capacitor ($C_{x2}$) are coupled to ground and the crystal 404. They are typically designed to have substantially similar capacitance values.

The amplifiers 412 and the second feedback component 414 are configured to yield a fast starting time by providing a relatively high negative resistance value. The amplifiers 412 are provided with a multi-stage bias current (IBias), which is selected to yield a desired negative resistance and oscillator starting time.

The changeover component 406 is coupled to the single stage oscillator 401 and the multi-stage oscillator 402. The changeover component 406 receives both oscillation outputs 420 and 422. The changeover component 406 provides an oscillator output 424, also referred to as a system output. The oscillator output 424 is derived from the received oscillations 420 and 422.

The changeover component 406 (406a and 406b) is shown as a pair of switches. The switches can be configured to selectively connect the single stage or the multiple stage or both. For example, the changeover component 406 could connect the single stage and the multi-stage to the crystal 404 at the same time.

As stated above, the changeover component 406 combines or selects one or more of the outputs 420 and 422 to derive or generate the system output 424. In this example, the multi-stage oscillator 402 has a faster starting time, thus the multi output 422 is used initially. After some amount of time, the single stage oscillator 401 has sufficiently started and the changeover component utilizes the single stage output 420 to derive the system output 424. Once the single stage output 420 is being utilized, the changeover component 406 can cause the multi-stage oscillator 402 to power down and mitigate power consumption.

The changeover component 406 is shown including switches to direct output signals 420 and 422 to the oscillator output signal 424. However, it is appreciated that other suitable mechanisms can be employed, such as switch mechanisms, mixers, and the like. The changeover component 406 determines when and which output signal to utilize. In one example, the changeover component 406 uses the multi-stage output signal 420 for a first period of time and then switches to the single stage output signal 422. In another example, the changeover component 406 initially uses the multi-stage output signal 420 and monitors the single-stage oscillator 401. On determining that the single stage oscillator 401 is producing a stable output signal at the selected frequency for the signal 422, the changeover component 406 uses the single stage output 422.

As a result, the system 400 provides an output 424 with a relatively short starting time, a stable, reliable oscillation signal, and relatively low power consumption. The multi-stage oscillator 402 provides the relatively short starting time and the single stage oscillator 401 provides the stable reliable signal and relatively low power consumption.

It is appreciated that alternate embodiments of the invention include variations of the above, including using varied components and oscillators.

Figure 5:
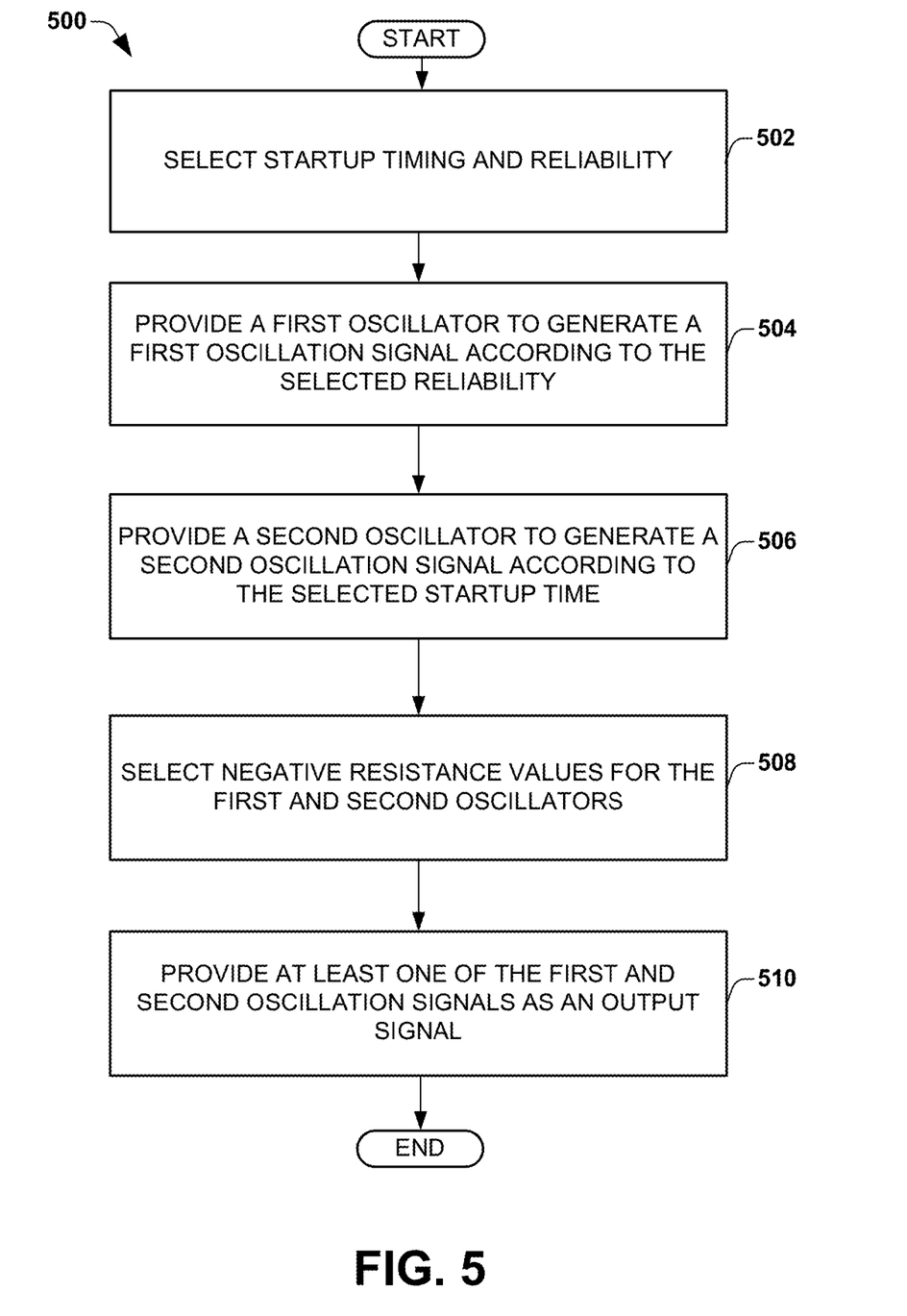
FIG. 5 is a flow diagram illustrating a method of operating an oscillator system.

FIG. 5 is a flow diagram illustrating a method 500 of operating an oscillator system. The method 500 combines or utilizes oscillation signals generated by varied oscillator structures or portions to obtain the benefits of each. As a result, a faster starting oscillator can be combined with a lower power and more reliable oscillator to yield faster starting times with lower power and higher reliability.

The method 500 begins at block 502, where an oscillation frequency, oscillation starting time and reliability/stability factors are selected. The oscillation frequency is a frequency or a range of frequencies. The oscillation starting time is a time period or duration in which an oscillation frequency is needed. The reliability or stability factor is the stability or reliability of the oscillation.

A first oscillator is provided to generate a first oscillation signal at the selected oscillation frequency with the selected reliability at block 504. The first oscillator can include a single stage oscillator, as shown above. Alternately, the first oscillator can include multiple stages and other circuitry in order to meet the selected reliability. The selected reliability can include resistance to variations in temperature, stress, and the like.

A second oscillator is provided to generate a second oscillation signal at about the selected oscillation frequency according to the selected starting time at block 506. Here, the more important factor is the selected starting time and not the other factors. A lower reliability or stability factor can be utilized because the selected reliability will be provided by the first oscillation signal. Thus, deviations from the selected frequency may be permitted. Additionally, variations in frequency and stability due to operating conditions, such as stress and temperature, may occur.

The second oscillator can comprise one or more stages. In one example, the second oscillator generates the second oscillation signal with three amplifier stages. This permits a greater range of negative resistance values to utilize.

Negative resistance values are selected for the first oscillator and the second oscillator at block 508 at least partially according to the selected starting time. The negative resistance values relate to the bias current for respective amplification stages of the oscillators. The negative resistance values also facilitate stability of oscillation and other factors. A suitable technique for selecting the negative resistance values, such as those shown above, can be employed.

At least one of the first oscillation signal and the second oscillation signal are provided as an output signal at block 510. A changeover component, such as described above, can be utilized to provide the oscillator output signal. In one example, the output signal can be one or the other of the first oscillation signal and the second oscillation signal. As another example, the output signal can be a combination of the first oscillation signal and the second oscillation signal. The output signal is typically provided to a resonator, which generates an oscillation output signal.

Generally, the second oscillation signal is utilized first as the second oscillator has a faster starting time. However, once the first oscillation signal is stable, the first oscillation signal is primarily used. In one example, the first oscillation signal is stable after a set period of time. In another example, the first oscillation signal is deemed stable after monitoring and determining that the selected frequency and reliability has been met.

Various mechanisms, including those shown above, can be utilized to provide the oscillator output signal. In one example, switches are controlled to selectively provide one of the first oscillation signal and the second oscillation signal as the oscillator output signal.

While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the circuits or systems shown in FIGS. 1-4, etc., are non-limiting examples of circuits or devices that may be used to implement method 500). The term "article of manufacture" as used herein is intended to encompass a computer program accessible from any computer-readable device, carrier, or media. Those skilled in the art will recognize many modifications may be made to this configuration without departing from the scope or spirit of the claimed subject matter.

One embodiment of the present invention relates to an oscillator system. The system includes a first oscillator, a second oscillator, and a changeover component. The first oscillator is configured to generate a first signal at a selected frequency. The second oscillator is configured to generate a second signal at about the selected frequency. The changeover component is configured to generate an output signal according to the first signal and the second signal. In one variation, the system further includes a resonator and the changeover component is configured to connect the resonator to the first oscillator, to the second oscillator, or to the first and second oscillators.

Another embodiment of the present invention relates to an oscillator system. The system includes a single stage portion, a multi-stage portion, a crystal and a changeover component. The single stage portion has a single amplification stage. The multi-stage portion has a plurality of amplification stages. The crystal has a resonant frequency, typically selected to yield a desired frequency. The changeover component is coupled to the crystal, the single stage portion and the multi-stage portion. The changeover component switches a changeover output from the multi-stage portion to the single stage portion according to oscillation characteristics of the single stage portion.

Yet another embodiment of the invention relates to a method of operating an oscillator system. An oscillation frequency, oscillation starting time, and reliability/stability factors are selected. A first oscillator is provided that generates a first oscillation signal at the selected oscillation frequency and the selected reliability. A second oscillator is provided that generates a second oscillation signal according to the selected oscillation starting time. At least one of the first oscillation signal and the second oscillation signal are provided as a changeover output signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An oscillator system comprising:
   a first oscillator structure configured to generate a first signal at a first selected frequency;
   a second oscillator structure configured to generate a second signal at a second selected frequency; and
   a changeover component configured to receive the first signal and the second signal, to monitor an amplitude of the first signal, to disable the second signal upon the amplitude exceeding a threshold value, and to generate an output signal according to the first signal and the second signal, wherein the output signal is based solely on the second signal for a first period of time and on the first signal for a second period of time, the second period of time occurring after the first period of time.

2. The system of claim 1, wherein the first oscillator structure is a single stage oscillator.

3. The system of claim 1, wherein the second oscillator structure is a multi-stage oscillator and the second oscillator structure is provided with a bias current selected to yield a negative resistance and oscillator starting time.

4. The system of claim 3, wherein the changeover component is configured to utilize the second signal for the first period of time and utilize the first signal after the first period of time.

5. The system of claim 3, further comprising a resonator, wherein the changeover component is configured to utilize one of the first signal and the second signal to generate the output signal, and wherein the resonator generates an oscillator output signal from the output signal from the changeover component.

6. The system of claim 3, wherein the changeover component is configured to utilize one of the first signal and the second signal according to first characteristics of the first oscillator structure and second characteristics of the second oscillator structure.

7. The system of claim 6, wherein the first characteristics include a relatively slow oscillator starting time and stable oscillation and the second characteristics include a relatively fast oscillator starting time.

8. The system of claim 1, wherein the first oscillator structure is a multi-stage oscillator and the second oscillator is also a multi-stage oscillator, wherein the first oscillator has a slower oscillator starting time.

9. The system of claim 1, further comprising a resonator configured to generate an oscillator output signal, wherein the changeover component is configured to connect the resonator to the first oscillator structure, to the second oscillator structure, or to the first and the second oscillator structures.

10. The system of claim 1, further comprising a resonator that generates an oscillator signal from the output signal.

11. The system of claim 1, wherein the second oscillator structure has a higher absolute value negative resistance than the first oscillator.

12. An oscillator system comprising:
a single stage portion configured to generate a first signal;
a multi-stage portion configured to generate a second signal;
a crystal; and
a changeover component coupled to the crystal, the single stage portion and the multi-stage portion, wherein the changeover component is configured to receive the first signal and the second signal, to monitor oscillation characteristics of the first signal, the oscillation characteristics including an amplitude of the first signal and to disable the second signal on the amplitude exceeding a threshold value, and to generate an output signal, wherein the output signal is based solely on the second signal for a first period of time and on the first signal for a second period of time, the second period of time occurring after the first period of time.

13. The system of claim 12, wherein the oscillation characteristics include a starting time for the single stage portion.

14. The system of claim 12, wherein the oscillation characteristics include oscillation stability of the single stage portion.

15. The system of claim 12, wherein the changeover component is configured to monitor at least the single stage portion to obtain the oscillation characteristics.

16. The system of claim 12, wherein the second signal of the multi-stage portion is impacted by operating conditions consisting of temperature and stress.

17. A method of operating an oscillator system, the method comprising:
selecting an oscillation frequency, oscillation starting time and reliability;
providing a first oscillator to generate a first signal at the selected oscillation frequency and the selected reliability;
providing a second oscillator to generate a second signal according to the selected oscillation starting time and at about the selected oscillation frequency;
receiving the first signal and the second signal by a changeover component;
monitoring the first signal for oscillation characteristics, including an amplitude; and
providing only one of the first signal and the second signal as a changeover output signal by the changeover component, wherein the second signal is provided for a first period of time and the first signal is provided for a second period of time and the second signal is disabled after the first period of time on the amplitude exceeding a threshold value.

18. The method of claim 17, further comprising selecting a first negative resistance for the first signal and a second negative resistance for the second signal, wherein the second negative resistance corresponds to the selecting oscillation starting time and the first negative resistance corresponds to a slower oscillation starting time.

19. The method of claim 17, wherein providing the changeover output signal based on only the first signal upon the amplitude exceeding a threshold value.

20. The method of claim 18, wherein providing the changeover output signal further comprises selecting one of the first oscillation signal and the second oscillation signal as the changeover output signal.

* * * * *